(12) United States Patent
Park et al.

(10) Patent No.: US 10,950,975 B1
(45) Date of Patent: Mar. 16, 2021

(54) PROGRESSIVE LATCH FOR ELECTRICAL MODULE

(71) Applicant: Arista Networks, Inc., Santa Clara, CA (US)

(72) Inventors: Youngbae Park, Milpitas, CA (US); Robert Morris Wilcox, Saratoga, CA (US); Richard Neville Hibbs, Redwood City, CA (US); Duong Cu Lu, Castro Valley, CA (US); Elliott Benard Van Hartingsveldt, San Jose, CA (US)

(73) Assignee: Arista Networks, Inc., Santa Clara, CA (US)

( * ) Notice: Subject to any disclaimer, the term of this patent is extended or adjusted under 35 U.S.C. 154(b) by 0 days.

(21) Appl. No.: 16/660,045

(22) Filed: Oct. 22, 2019

(51) Int. Cl.
*H01R 13/52* (2006.01)
*H01R 13/627* (2006.01)
*H01R 13/11* (2006.01)
*H05K 1/14* (2006.01)

(52) U.S. Cl.
CPC ......... *H01R 13/6271* (2013.01); *H01R 13/11* (2013.01); *H05K 1/141* (2013.01)

(58) Field of Classification Search
CPC .............. H01R 13/6271; H01R 13/625; H01R 13/623; H01R 13/11; H01R 13/10; H05K 1/141
USPC .......................................... 439/282, 310–314
See application file for complete search history.

(56) References Cited

U.S. PATENT DOCUMENTS

| 4,239,325 | A | * | 12/1980 | Tyson | .................... | H01R 13/64 |
| | | | | | | 439/314 |
| 4,387,947 | A | * | 6/1983 | Lostumo | ................ | H01R 13/53 |
| | | | | | | 439/281 |
| 4,850,890 | A | * | 7/1989 | Kuzuno | ........... | H01R 13/62905 |
| | | | | | | 439/310 |
| 7,306,472 | B2 | * | 12/2007 | Matsumoto | ........ | H01R 13/6273 |
| | | | | | | 439/314 |

* cited by examiner

*Primary Examiner* — Khiem M Nguyen
(74) *Attorney, Agent, or Firm* — Chamberlain, Hrdlicka, White, Williams & Aughtry

(57) ABSTRACT

In general, embodiments relate to systems for latching electrical modules to one another. Specifically, embodiments provide for a latching assembly to mechanically aid an operative connection between electrical modules. Further, embodiments enable a user to physically latch electrical modules to one another and to retain the latching of the electrical modules.

20 Claims, 10 Drawing Sheets

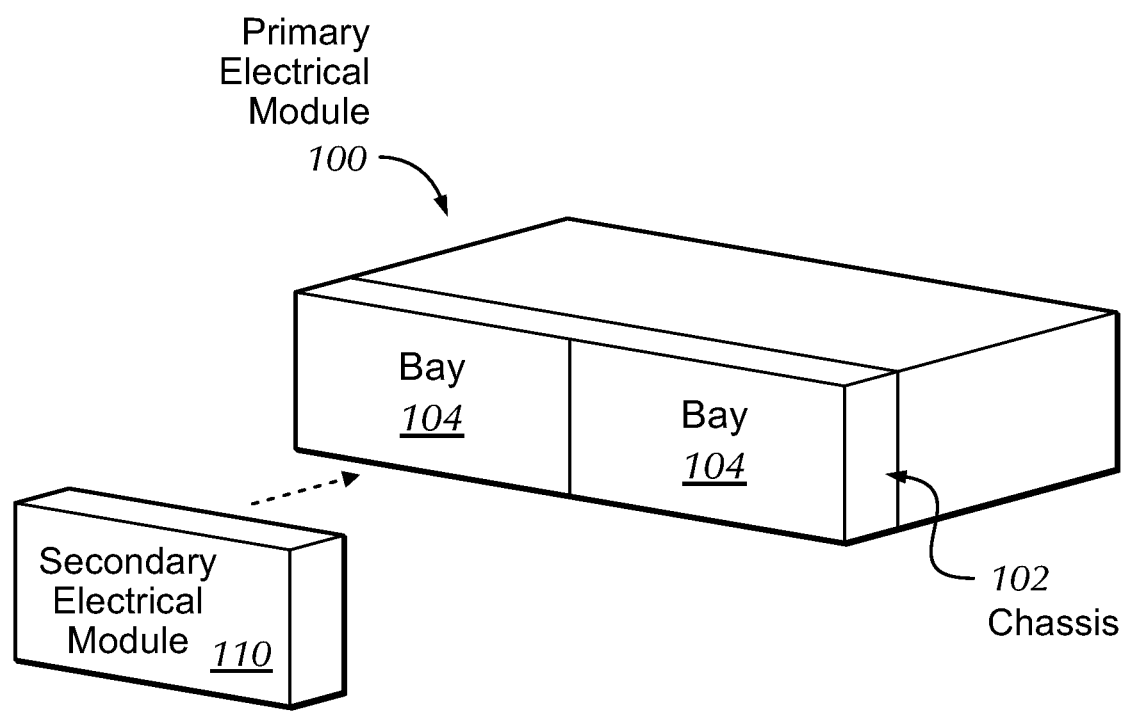
*FIG. 1.1*

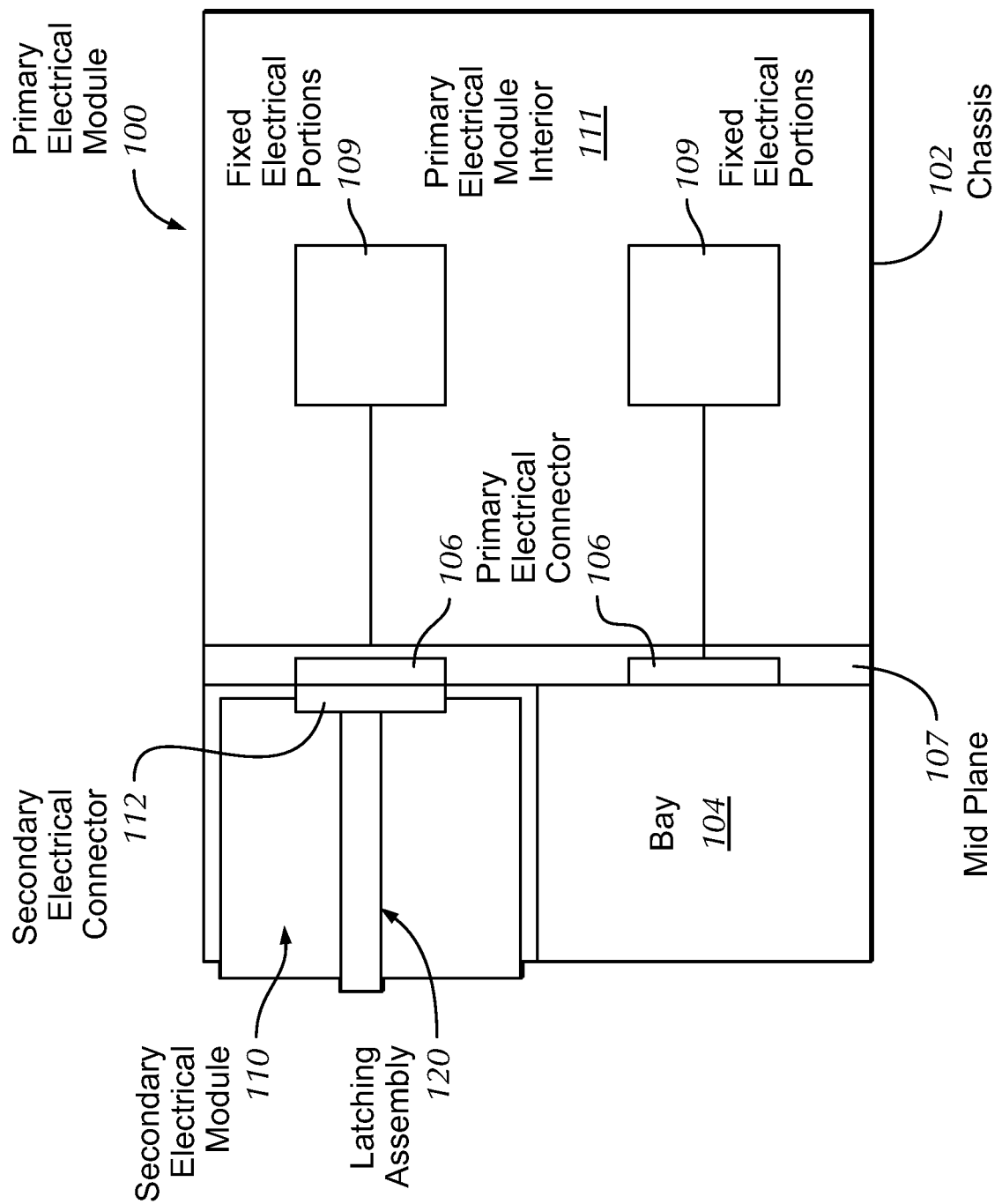
FIG. 1.2

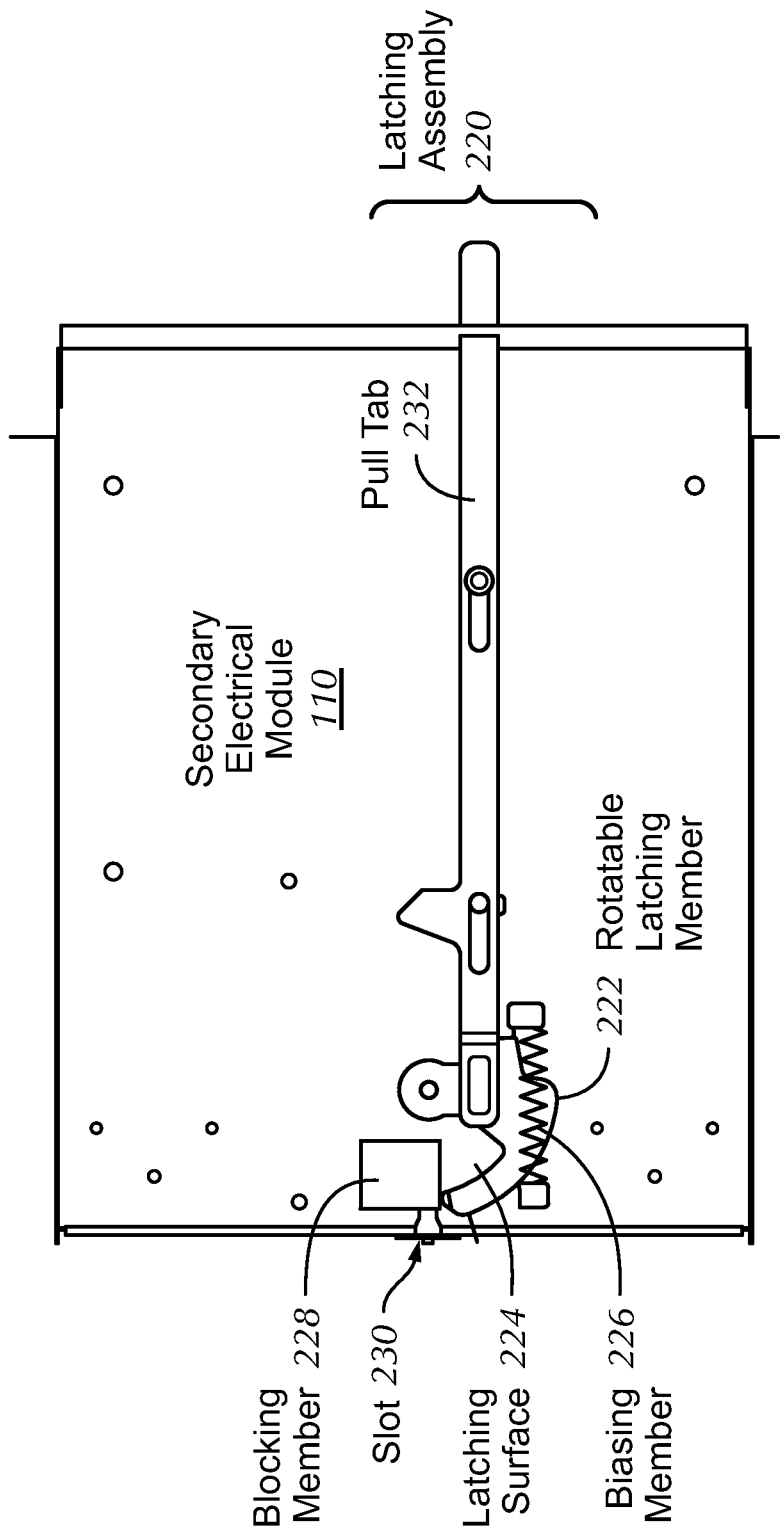
FIG. 3.1

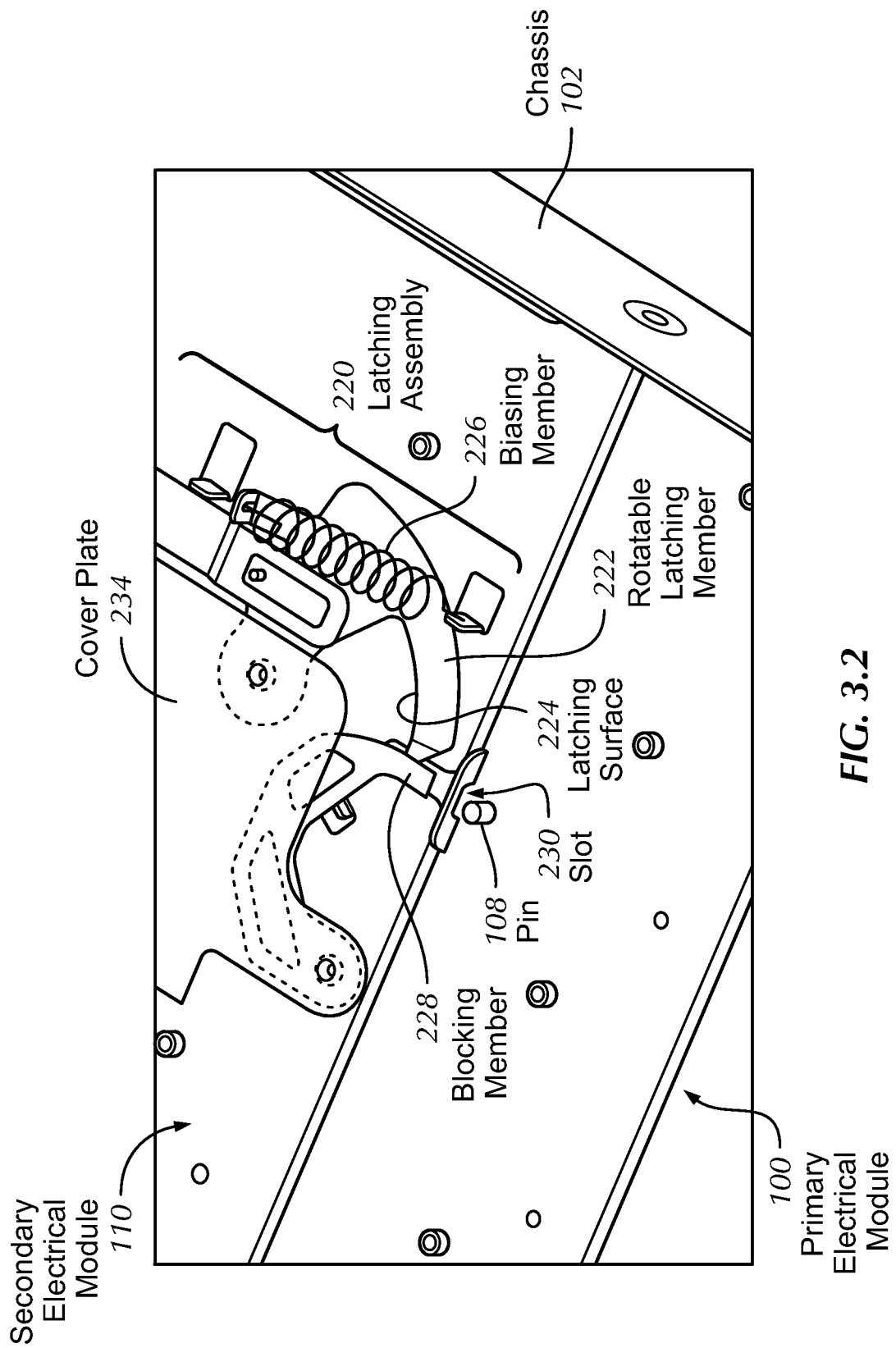
FIG. 3.2

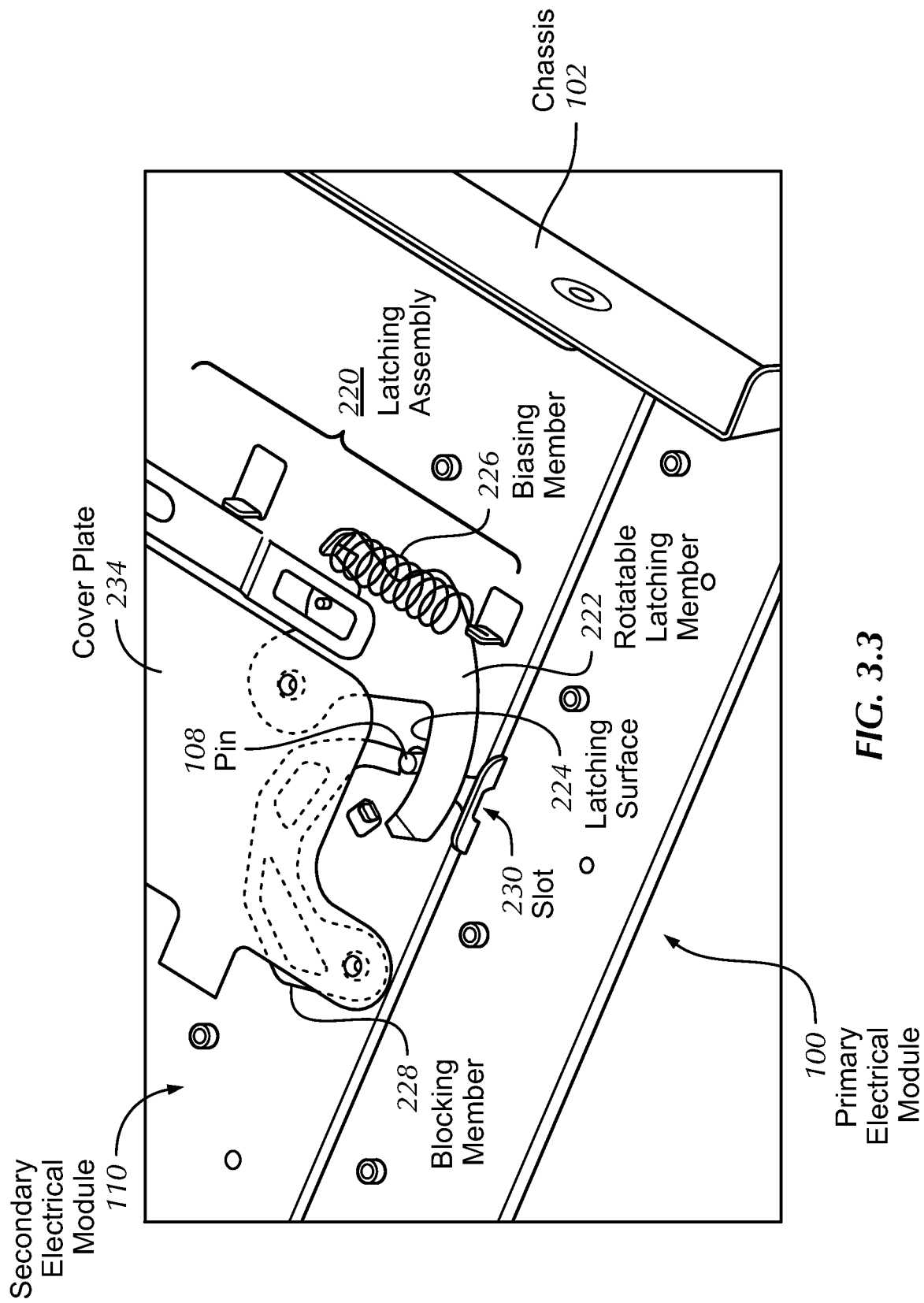
FIG. 3.3

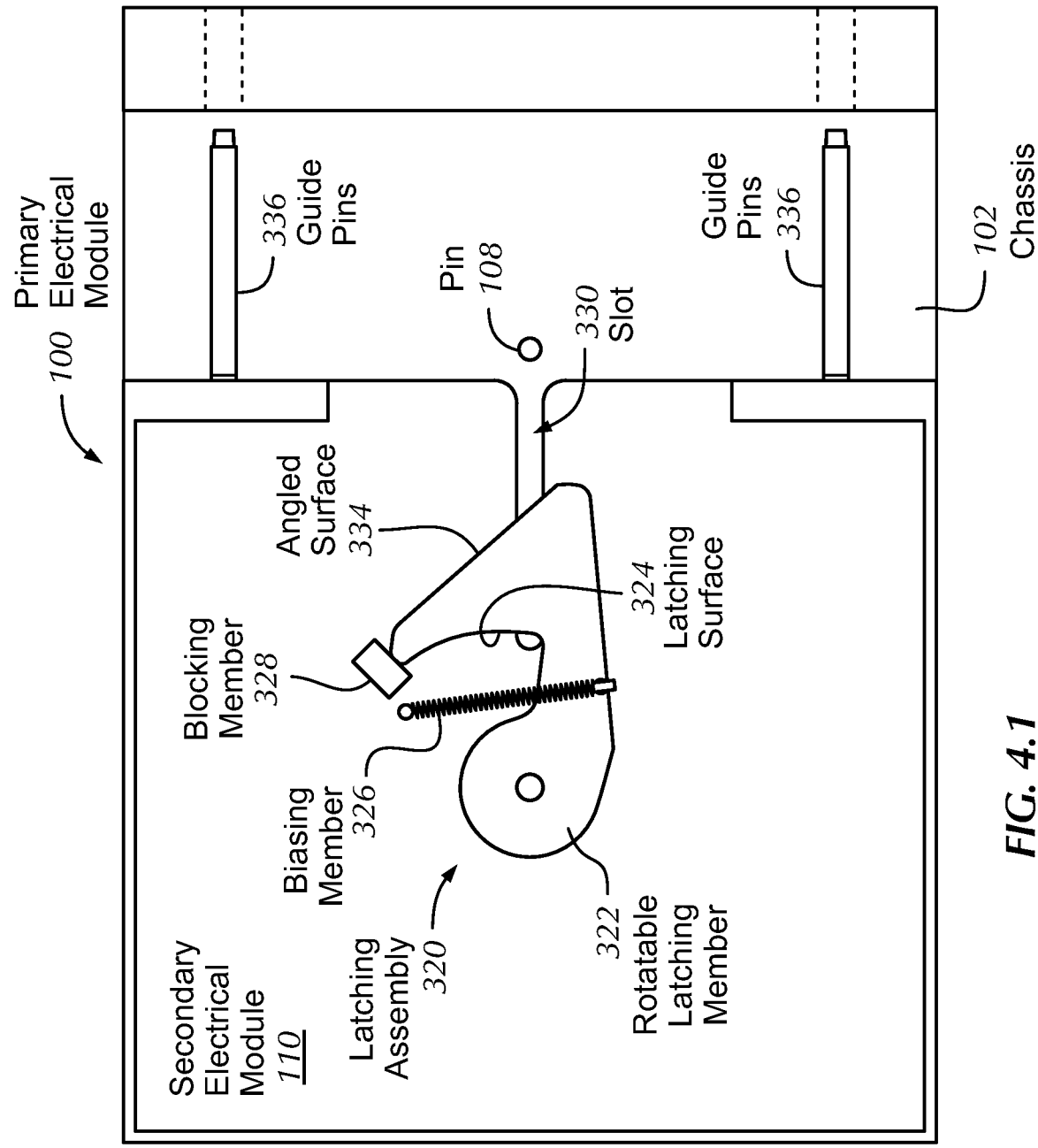
FIG. 4.1

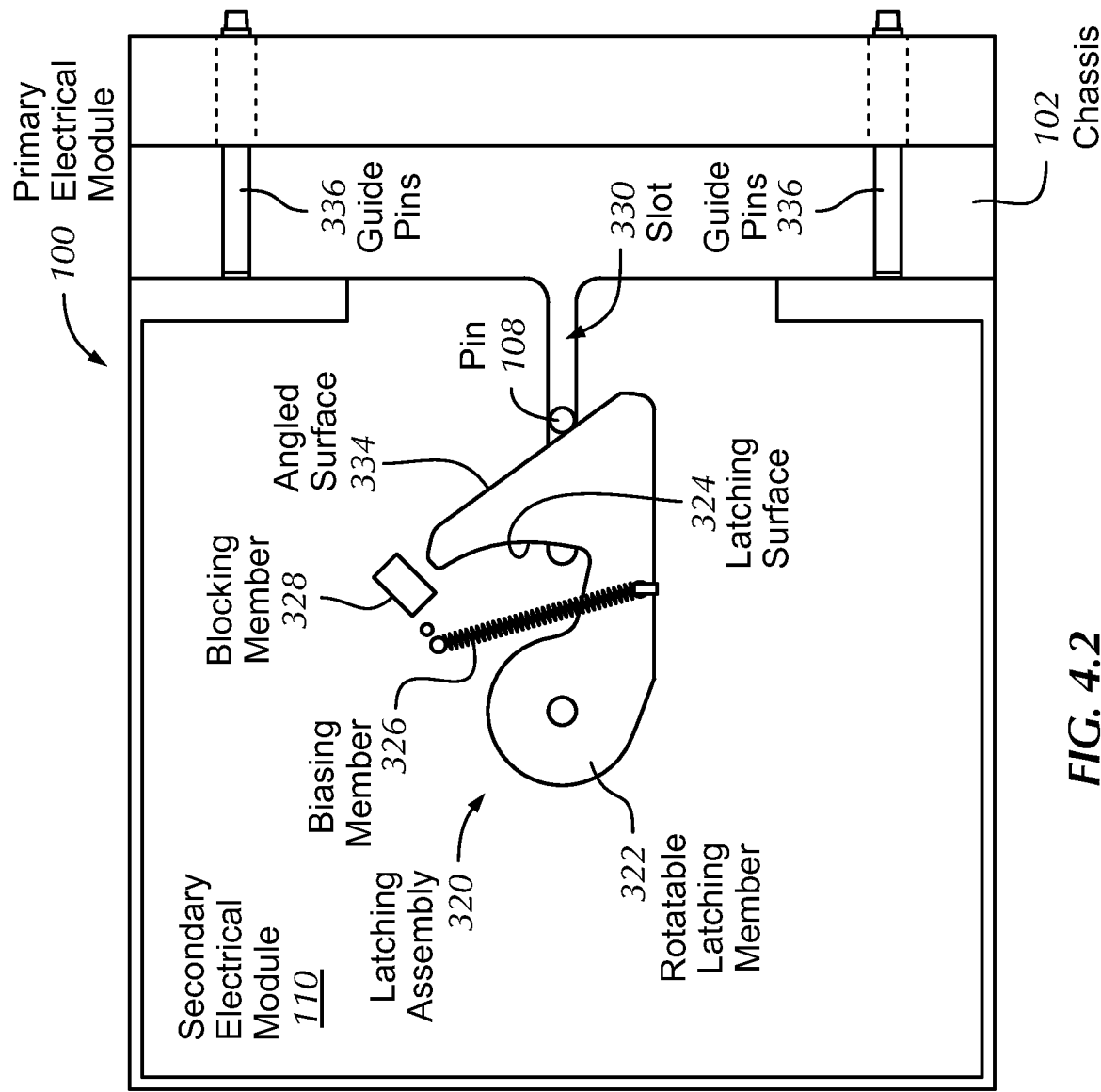
FIG. 4.2

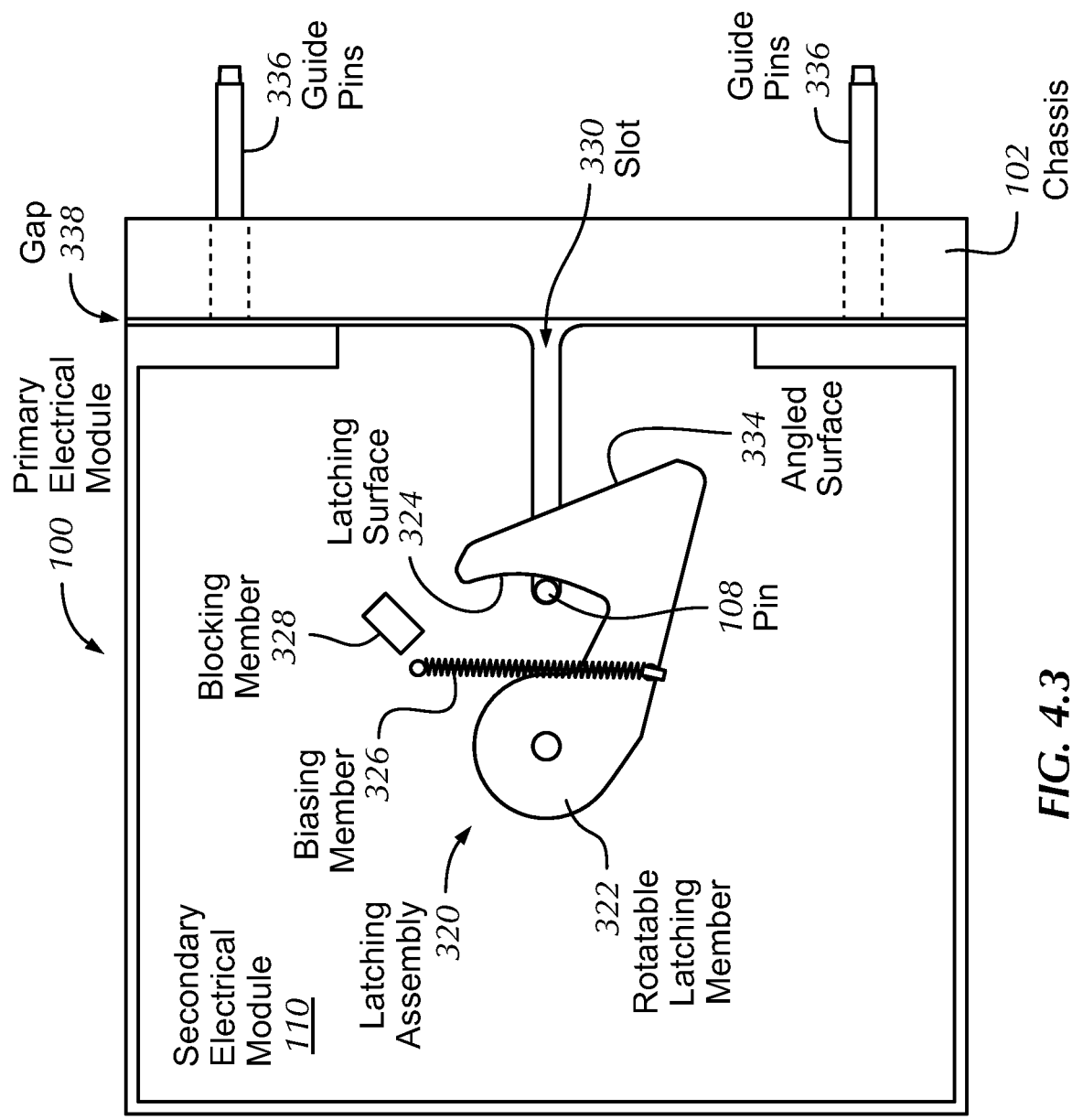
FIG. 4.3

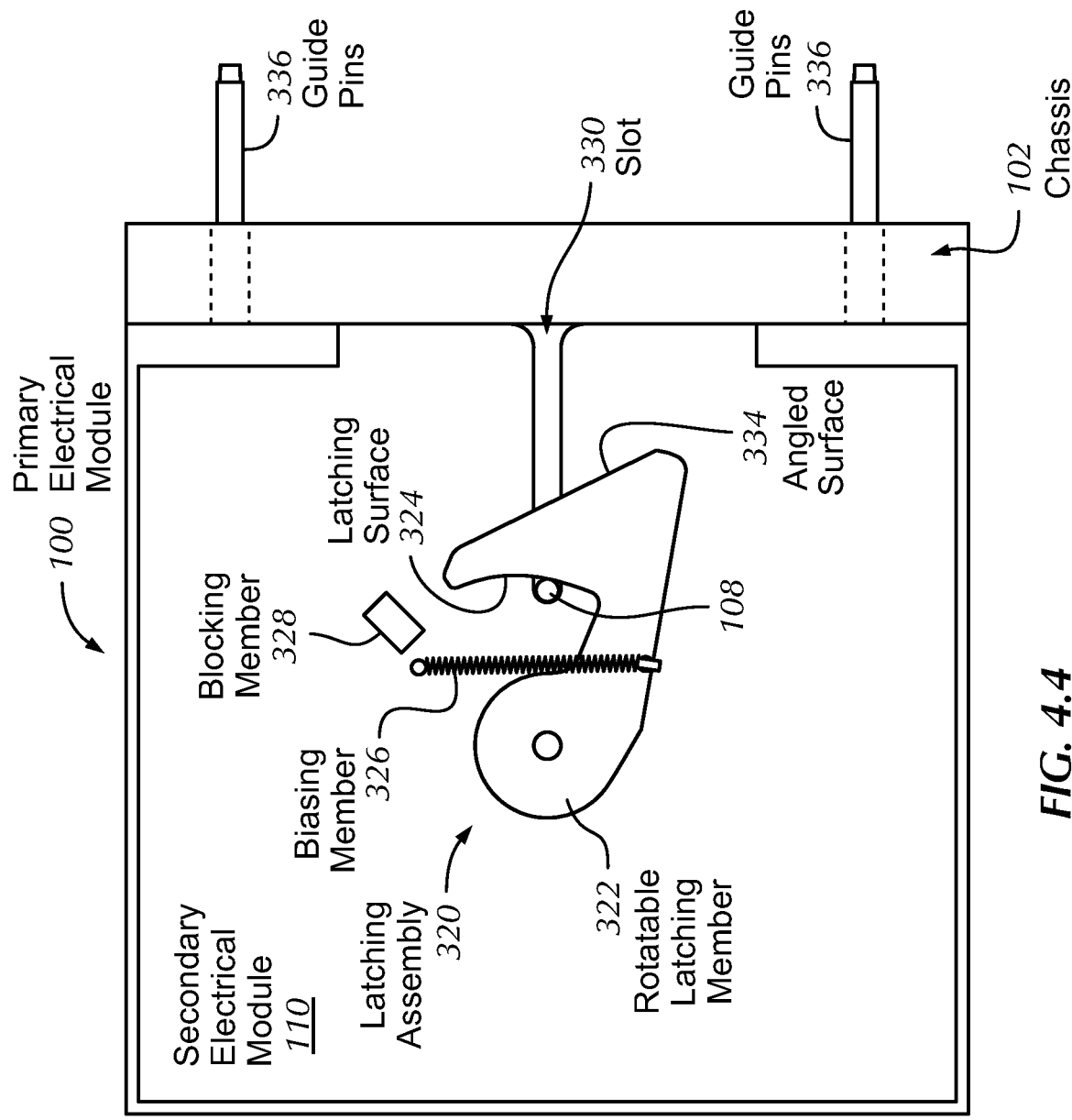
FIG. 4.4

PROGRESSIVE LATCH FOR ELECTRICAL MODULE

BACKGROUND

In most modular electrical systems, individual electrical modules are connected together to form an electrical system with connectors. The physical and electrical connections between the electrical modules should be secure enough to prevent inadvertent disconnecting or interruption. The electrical modules may include one or more mechanisms to aid the insertion, removal and, retention of the module. Moreover, some connectors are designed to mated with precise depth. A mechanisms that perform these functions are traditionally complex and have a large physical footprint.

SUMMARY

In general, in one aspect, the invention relates to a latching assembly for latching an electrical module to a chassis. The assembly comprises a rotatable latching member comprising a latching surface with a radius of curvature, a biasing member coupled to the rotatable latching member to bias the rotatable latching member toward a latched position, a blocking member positioned to engage and block the rotatable latching member from rotating toward the latched position, and a slot configured to receive a pin of the chassis such that the rotatable latching member rotates to the latched position in response to the pin being received in the slot In general, in one aspect, the invention relates to a system. The system comprises a chassis comprising a bay for receiving an electrical module, an electrical connector positioned within the bay, and a pin protruding from a surface of the bay; and the electrical module. The electrical module comprises a rotatable latching member comprising a latching surface with a radius of curvature, a biasing member coupled to the rotatably latching member to bias the rotatable latching member toward a latched position, a blocking member positioned to engage and block the rotatable latching member from rotating toward the latched position, and a slot configured to receive the pin of the chassis such that the rotatable latching member rotates to the latched position in response to the pin being received in the slot.

BRIEF DESCRIPTION OF DRAWINGS

FIG. 1.1 shows a system in accordance with one or more embodiments.

FIG. 1.2 shows a top view of a connection between electrical modules in accordance with one or more embodiments.

FIG. 3.1 shows a top view of a progressive latch assembly in accordance with one or more embodiments.

FIG. 3.2 shows a perspective view of the progressive latch assembly of FIG. 3.1 in accordance with one or more embodiments.

FIG. 3.3 shows a perspective view of the progressive latch assembly of FIG. 3.1 in accordance with one or more embodiments.

FIG. 4.1 shows a top view of a progressive latch assembly in accordance with one or more embodiments.

FIG. 4.2 shows a top view of the progressive latch assembly of FIG. 4.1 in accordance with one or more embodiments.

FIG. 4.3 shows a top view of the progressive latch assembly of FIG. 4.1 in accordance with one or more embodiments.

FIG. 4.4 shows a top view of the progressive latch assembly of FIG. 4.1 in accordance with one or more embodiments.

DETAILED DESCRIPTION

Figure 2:
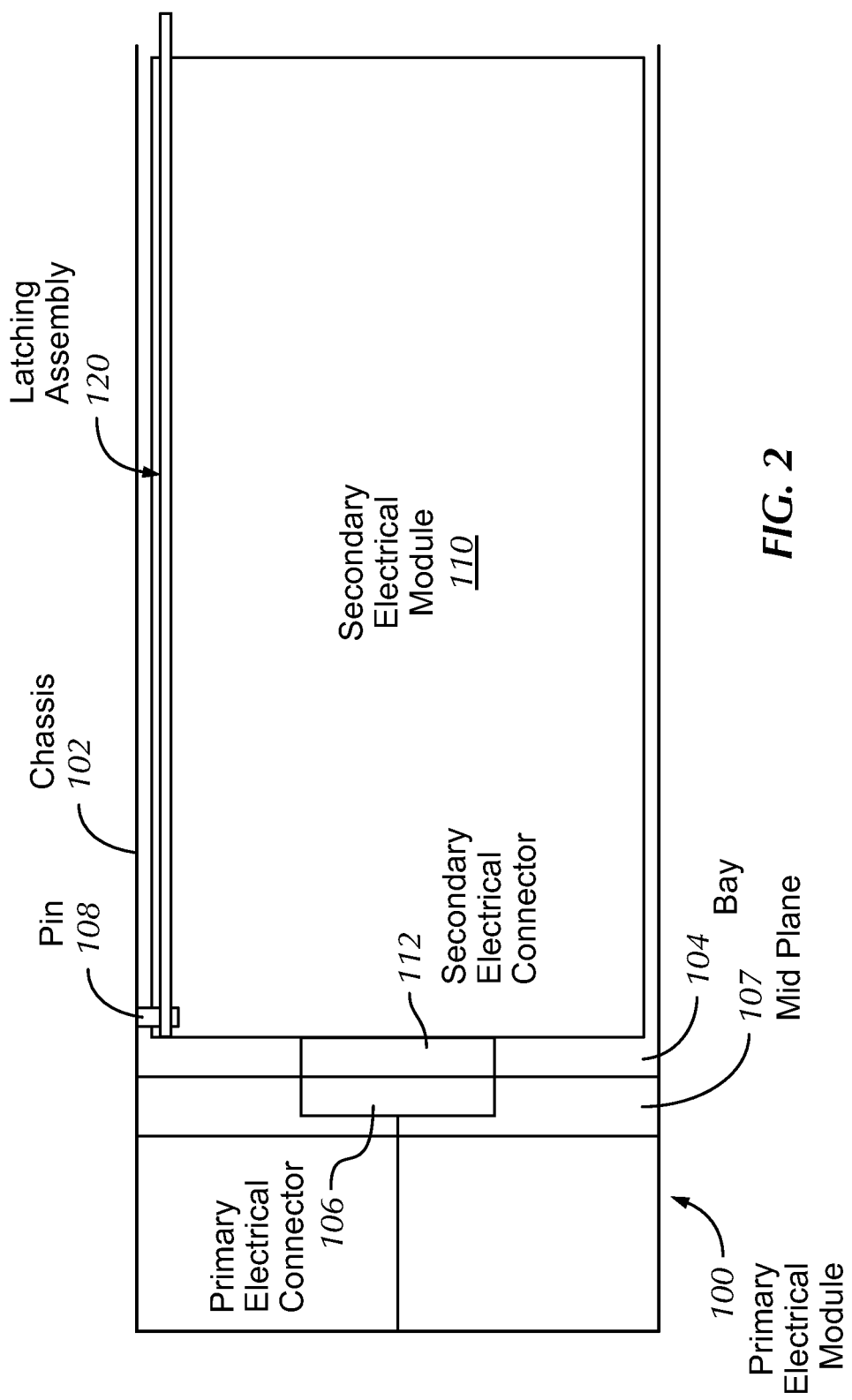
FIG. 2 shows a side view of a connection between electrical modules in accordance with one or more embodiments.

Specific embodiments will now be described in detail with reference to the accompanying figures. In the following detailed description of embodiments, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

In the following description of FIGS. 1.1-4.4, any component described with regard to a figure, in various embodiments, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named components. Additionally, in accordance with various embodiments, any description of the components of a figure is to be interpreted as an optional embodiment, which may be implemented in addition to, in conjunction with, or in place of the embodiments described with regard to a corresponding like-named component in any other figure.

In general, embodiments relate to systems for latching electrical modules to one another. Specifically, embodiments provide for a latching assembly to mechanically aid an operative connection between electrical modules. Further, embodiments enable a user to physically latch electrical modules to one another and to retain the latching of the electrical modules.

In various embodiments, a first electrical module includes a compact latching assembly that includes a latching surface with a radius of curvature that reduces along the face of the latching surface. As the second electrical module is pushed towards the first electrical module, the latching surface fills the clearance with the mating latching feature, until the second electrical module is unable to be further inserted. By doing so, the second electrical module is latched to the first electrical module without any backlash or movement, regardless of slight physical variations on first and/or second electrical modules.

FIG. 1.1 shows an example system in accordance with one or more embodiments of the invention. As shown in FIG. 1, the system includes a primary electrical module (100) with a chassis (102), bays (104), and one or more secondary electrical modules (110). While for the sake of brevity the system of FIG. 1.1 has been illustrated as including a limited number of components, embodiments may include additional components than those shown in FIG. 1.1 without departing from the invention. Each component of the system of FIG. 1.1 is described below.

In one or more embodiments of the invention, any of the components of FIG. 1.1 may be operatively connected. As used herein, the term operatively connected, or operative connection, means that there exists between elements/components/devices a direct or indirect connection that allows the elements to interact with one another in some way (e.g., via the exchange of information). For example, the phrase 'operatively connected' may refer to any direct, physical connection.

In one or more embodiments of the invention, the primary electrical module (100) and the one or more secondary electrical modules (110), when combined, form a modular system (e.g., a network device, as described below). The modular system may enable the primary electrical module (100) to be a scalable system. For example, the primary electrical module (100) may receive one or more secondary electrical modules (110). Further, the primary electrical module (100) may function regardless of the number of secondary electrical modules (110) connected to the primary electrical module (100).

In one or more embodiments of the invention, the primary electrical module (100) and the one or more secondary electrical modules (110) are physical devices. The physical device may be a computing device. The computing device is any device or any set of devices capable of electronically processing instructions and may include, but is not limited to, any of the following: one or more processors (not shown), memory (e.g., random access memory (RAM)) (not shown), persistent storage (not shown), one or more physical interfaces (e.g., network ports) (not shown), any number of other hardware components (not shown) or any combination thereof. In one or more embodiments of the invention, the computer device includes any number of components (e.g., network chips, field programmable gate arrays (FPGAs), etc.) In one or more embodiments of the invention, a network chip is any hardware (e.g., circuitry such as, for example, application specific integrated circuits (ASICs)), which may include software and/or firmware, that includes functionality related to receiving, processing, and/or transmitting network traffic data units in accordance with one or more embodiments of the invention.

In one or more embodiments of the invention, the primary electrical module (100) includes the chassis (102) that includes one or more physical sides that may provide physical support for components contained within the primary electrical module (100). For example, connectors, such as electrical connectors may be mounted within the chassis (102). For example, the chassis (102) may include up to six enclosed sides to form a rectangular prism. Further, the chassis (102) may provide physical support for components connected to the primary electrical module (100), such as the one or more secondary electrical modules (110).

In one or more embodiments of the invention, the chassis (102) may include one or more openings to enable components within the primary electrical module (100) to physically connect to components outside the chassis (102). For example, the chassis (102) may form one or more bays (104) in which one or more sides of the chassis (102) are open to receive the secondary electrical module (110) and to enable the secondary electrical module (110) to physically connect to the primary electrical modules (100). In one or more embodiments of the invention, the chassis (102) may form a portion of a rectangular prism and may be open on one, two, three, four, or five sides. Further, the chassis (102) may be only partially open on any of the sides. In addition, the chassis (102) may include any number of openings or bays (104) on one of the sides. As shown in FIG. 1.1, the chassis (102) includes two openings, or bays (104) on one side to each receive a secondary electrical module (110).

In one or more embodiments of the invention, the bay (104) is an opening in the chassis (102), as described above. The bay (104) may extend into the chassis (102) such that a portion, or all of the secondary electrical module (110) fits within the bay (104). Further, the bay (104) may be sized to fit multiple different sizes of secondary electrical modules (110). For example, different secondary electrical modules (110) that include different dimensions may fit within the same bay (104). Further, the bay (104) may be sized to fit any number of secondary electrical modules (110). For example, the bay (104) may receive one or more secondary electrical modules (110).

In one or more embodiments of the invention, the primary electrical module (100) includes one or more connectors (not shown) within the bay (104) to operatively connect to the secondary electrical module (110). The operative connection between the primary electrical module (100) and the secondary electrical module (110) may include a physical connection. The physical connection may be made only when the secondary electrical module (110) is at a certain position in relation to the primary electrical module (100). In one or more embodiments of the invention, the secondary electrical module (110) includes a latching assembly to physically connect the second electrical modules (110) to the primary electrical module (100), as shown in FIGS. 2-4.4. By including the latching assembly, the secondary electrical module (110) may retain its positional relationship with the primary electrical module (100). Further, the latching assembly may bias the secondary electrical module (110) to operatively connect with the primary electrical module (100). Further, in some embodiments, the latching assembly may be included with the primary electrical module (100), and latch to the secondary electrical module (110).

In one or more embodiments of the invention, the primary electrical module (100) and/or the secondary electrical module (110) are operatively connected to form a network device. Examples of a network device include, but are not limited to, a network switch, a router, a multilayer switch, a fiber channel device, an InfiniBand® device, etc. A network device is not limited to the aforementioned specific examples.

In one or more embodiments of the invention, a network device includes functionality to receive network traffic data units (e.g., frames, packets, tunneling protocol frames, etc.) at any of the physical network interfaces (i.e., ports) of the network device and to process the network traffic data units to determine whether to: (i) drop the network traffic data unit; (ii) process the network traffic data unit; and/or (iii) transmit the network traffic data unit, based on the processing, from a physical network interface or port on the network device in accordance with one or more embodiments of the invention. For example, the latching assembly may retain the operative connection that provides the above-mentioned functionality.

In one or more embodiments of the invention, the network device is part of a network (not shown). A network may be an entire network or any portion thereof (e.g., a logical portion of network devices within the network topology, external to the network topology, etc.). A network may include a datacenter network, a wide area network, a local area network, a wireless network, a cellular phone network, or any other suitable network that facilitates the exchange of information from one part of the network to another. In one or more embodiments, the network may be coupled with or overlap, at least in part, with the Internet.

In one or more embodiments of the invention, a network includes a collection of one or more network devices (e.g., network device that facilitates network connectivity for one or more operatively connected devices (e.g., computing devices, data storage devices, other network devices, etc.)). In one or more embodiments of the invention, the network device and other devices within the network (not shown) are arranged in a network topology. In one or more embodiments of the invention, a network topology is an arrangement of various elements of a network.

FIG. 1.2 shows a cut-away view of an operative connection between the primary electrical module (100) and the secondary electrical module (110) in accordance with one or more embodiments of the invention. The primary electrical module (100) includes a midplane (107) in which primary electrical connectors (106) are positioned. The midplane (107) may include a physical support to hold the primary electrical connectors (106) in a fixed position, while also preventing components, such as the secondary electrical module (110), from entering a primary electrical module interior (111). The primary electrical connectors (106) are operatively coupled to one or more fixed electrical portions (109). Each fixed electrical portion (109) may include any number of electrical components operatively coupled to the midplane (107).

In one or more embodiments of the invention, the primary electrical connectors (106) are physically mounted onto the chassis (102) of the primary electrical module (100) at the midplane (107). The physical mounting may include screws, welds, bolts, pins, or other mounting components. The primary electrical connectors (106) may be statically mounted onto the chassis (102). Further, any number of primary electrical connectors (106) may be included, such as one or more primary electrical connectors (106).

As shown, one of the primary electrical connectors (106) of the primary electrical module (100) is operatively connected to a corresponding secondary electrical connector (112) of the secondary electrical module (110). Further, the secondary electrical module (110) includes a latch assembly (120) to latch the secondary electrical module (110) to the primary electrical module (100).

In one or more embodiments of the invention, the secondary electrical connector (112) is physically mounted to the secondary electrical module (110). The physical mounting may include screws, welds, bolts, pins, or other mounting components. The secondary electrical connector (112) may be statically mounted onto the secondary electrical module (110). Further, any number of secondary electrical connectors (112) may be included, such as one or more secondary electrical connectors (112). Further, the secondary electrical connectors (112) may be complementary to the primary electrical connectors (106) such that the secondary electrical connectors (112) and the primary electrical connectors (106) may be operatively connected to thereby operatively connect the primary electrical module (100) and the secondary electrical module (110). For example, one of the electrical connectors of the primary electrical connectors (106) and the secondary electrical connectors (112) may be considered a female connector, and the complementary connector may be considered a male connector. Further, the number of primary electrical connectors (106) and secondary electrical connectors (112) may not match. For example, one set of the primary electrical connectors (106) and the secondary electrical connectors (112) may include more connectors than the other set of the primary electrical connectors (106) and the secondary electrical connectors (112).

In one or more embodiments of the invention, the latch assembly is a physical device. The secondary electrical module (110) may include the latch assembly (120) to connect the secondary electrical module (110) to the primary electrical module (100). The operative connection between the primary electrical connectors (106) and the secondary electrical connectors (112) may be considered a loose connection whereby the connection may inadvertently be undone in response to physical perturbations not intended to undo the operative connection. As such, the latch assembly (120) may provide additional physical support to secure the operative connection between the primary electrical connectors (106) and the secondary electrical connectors (112).

In one or more embodiments of the invention, the latch assembly (120) may be mounted within the secondary electrical module (110). For example, to minimize the space requirements for the latch assembly (120), the latch assembly (120) may be included against one of the surfaces of the secondary electrical module (110). For example, the latch assembly (120) may be included between a bottom side of the secondary electrical connectors (112) and a surface of the secondary electrical module (110). The latch assembly (120) includes a latching surface with a radius of curvature that decreases along its length. As such, when the latch assembly (120) latches to the primary electrical module (100), the latch assembly (120) pulls the secondary electrical module (110) closer to the primary electrical module (100). By doing so, the latching assembly (120) may secure the operative connection between the primary electrical connectors (106) and the secondary electrical connectors (112), regardless of slight physical variations between different primary electrical modules (100) and secondary electrical modules (110).

FIG. 2 shows a side view of the primary electrical module (100) operatively coupled to the secondary electrical module (110). The chassis (102) includes a pin (108) that extends from an interior surface of the chassis (102) and into the bay (104). The pin (108) interacts with the latching assembly (120) of the secondary electrical module (110) as described in further detail below, to assist the latching assembly (120) in physically latching to a portion of the primary electrical module (100).

FIG. 3.1 shows a diagram of a latching assembly (220) in accordance with one or more embodiments of the invention. The latching assembly (220) may be used in place of the latching assembly (120) described above. As such, as discussed above, the latching assembly (220) may connect the secondary electrical module (110) to the primary electrical module (not shown). Further, the latching assembly (220) includes a rotatable latching member (222) with a latching surface (224), a biasing member (226), a blocking member (228), a slot (230), and a pull tab (232). Each of these components of the latching assembly (220) is discussed below.

The rotatable latching member (222) may be a physical device for physically coupling to another electrical module, such as the primary electrical module. The rotatable latching member (222) is rotatable about point of rotation and may be asymmetric about the point of rotation. The rotatable latching member (222) may extend in a radial direction from the point of rotation. Further, the rotatable latching member (222) includes a latching surface (224) that may engage a portion, such as a pin, of the primary electrical module. In one or more embodiments of the invention, the latching surface (224) is a curved surface with a decreasing radius of curvature along the length of the latching surface (224). As such, when the latch assembly (220) latches to the primary electrical module, the latch assembly (220) pulls the secondary electrical module (110) closer to the primary electrical module.

In one or more embodiments of the invention, the latching assembly (220) includes the biasing member (226) coupled to the rotatable latching member (222). The biasing member (226) may be a physical device such as a spring or any other device that provides a biasing force. A first end of the biasing member (226) may be coupled to the rotatable latching member (222) while a second end of the biasing member (226) is coupled to another portion of the latching assembly (220) or the secondary electrical module (110). For example, the biasing member (226) may be coupled to the rotatable latching member (222) at a point radially separated from the point of rotation to bias the rotatable latching member (222) into rotation. For example, the biasing member (226) may bias the rotatable latching member (222) toward a position in which the rotatable latching member (222) may be latched to the primary electrical module. Further, the biasing member (226) may be coupled to the rotatable latching member (222) such that the biasing force provided by the biasing member (226) only overcomes the frictional forces at the point of rotation when the biasing member (226) causes the rotatable latching member (222) to rotate. By doing so, the biasing member (226) may be smaller, less stiff, and/or have a lower spring constant than a biasing member (226) that overcomes additional forces to cause the rotatable latching member (222) to rotate.

The blocking member (228) may be a physical device that may block the rotatable latching member (222) from freely rotating. For example, the blocking member (228) may leave the rotatable latching member (222) in a cocked position, or in a ready to be used position, until the electrical modules are engaged. In one or more embodiments of the invention, multiple blocking members (228) may be included. For example, blocking members (228) may be included to block the rotational path of the rotatable latching member (222) in both rotational directions about the point of rotation. Further, the blocking member (228) may be rotatable from a first position to a second position. For example, in the first position, the blocking member (228) may block a certain amount of rotation of the rotatable latching member (222), and, in the second position, the blocking member (228) may block a lesser amount of rotation of the rotatable latching member (222). Further, the blocking member (228) may be positioned such that the rotatable latching member (222) is biased into physical engagement with the blocking member (228). As such, the blocking member (228) blocks rotation of the rotatable latching member (222) until the blocking member (228) moves out of engagement with the rotatable latching member (222). In one or more embodiments of the invention, the blocking member (228) rotates to move out of engagement with the rotatable latching member (222). Alternatively, the blocking member (228) may translate or translate and rotate to move out of engagement with the rotatable latching member (222).

Further, the latching assembly (220) and/or the secondary electrical module (110) may include the slot (230). The slot (230) may be an open area into which a portion of the primary electrical module may be received. For example, a protrusion, such as a pin, extending from a surface of the primary electrical module may enter the slot (230). In one or more embodiments of the invention, the protrusion of the primary electrical module enters the slot (230) as the primary electrical module and the secondary electrical module are operatively connected. In one or more embodiments of the invention, the blocking member (228) is positioned over the slot (230) to prevent the rotatable latching member (222) from rotating over the slot (230). Further, as a pin of the primary electrical module enters the slot (230), the pin physically engages the blocking member (228) and rotates the blocking member (228)

In an example operation, as shown in FIGS. 3.2-3.3, the secondary electrical module (110) may be pushed along the primary electrical module (100). For example, a user may push the secondary electrical module (110) into a bay of the primary electrical module (100), as discussed above. Before the secondary electrical module (110) is pushed into an operative connection with the primary electrical module (100), the blocking member (228) may be positioned over the slot (230), as discussed above. For example, the latching assembly (220) is considered to be in an unlatched position when in the position shown in FIG. 3.2.

In addition, the latching assembly (220) is shown as including a cover plate (234), which is transparent for illustration purposes. The cover plate (234) may be a physical device that provides additional structural support to the rotatable latching member (222) and the blocking member (228). For example, the points of rotation for both the rotatable latching member (222) and the blocking member (228) may be coupled to both the secondary electrical module (110) and the cover plate (234). By doing so, the points of rotation are provided an additional physical support and the rotatable latching member (222) and the blocking member (228) may be further prevented from rotating along more than one axis.

As discussed above, the primary electrical module (100) may include a pin (108) extending from a surface of the chassis (102). The pin (108) may be a physical device that extends from the chassis (102) to engage the latching assembly (220) to enable the latching assembly (220), and thus the secondary electrical module (110) to latch to the primary electrical module (100). The pin (108) may be integral to the chassis (102), or the pin (108) may be coupled to the chassis (102), such as by a weld, threads, a screw, a bolt, etc. The pin (108) is positioned on the chassis (102) such that the pin (108) enters the slot (230) when the secondary electrical module (110) is pushed into the bay of the primary electrical module (100).

As shown in FIG. 3.3, the pin (108) has entered the slot (230), and pushed the blocking member (228) out of engagement with the rotatable latching member (222). After the pin (108) passes the leading edge of the rotatable latching member (222), the biasing member (226) biases the rotatable latching member (222) into rotation around the pin (108). By doing so, the latching surface (224) engages the pin (108), thereby physically connecting the secondary electrical module (110) to the primary electrical module (100). For example, the latching assembly (220) is considered to be in the latched position in the position shown in FIG. 3.3.

Returning to FIG. 3.1, the latching assembly (220) includes the pull tab (232), which may be a physical device. The pull tab (232) enables a user to rotate the rotatable latching member (222) to disengage the rotatable latching member (222) from the pin (108) to remove the secondary electrical module (110) from the primary electrical module (100). For example, the pull tab (232) is connected to the rotatable latching member (222) at a point radially offset from the point of rotation such that axial movement of the pull tab (232) causes rotational movement of the rotatable latching member (222). Further, as discussed above, the biasing member (226) biases the rotatable latching member (222) to rotate. In one or more embodiments of the invention, the direction of rotation biased by the biasing member (226) opposes the direction of rotation caused by the pull tab (232). As such, the force applied to the pull tab (232) overcomes the force applied by the biasing member (226). In addition, the biasing member (226) biases the rotatable latching member (222) back to the latched position upon cessation of force applied to the pull tab (232).

In one or more embodiments of the invention, the pull tab (232) extends further than an end of the secondary electrical module (110). By doing so, a user may grab the pull tab (232) from outside of the secondary electrical module (110). Further, the pull tab (232) may be aligned with the opening of the bay of the primary electrical module (100) such that pulling on the pull tab (232) both causes the rotatable latching member (222) to rotate toward an unlatched position, and causes the secondary electrical module (110) to be pulled out of the bay of the primary electrical module (100).

FIGS. 4.1-4.4 show a diagram of a latching assembly (320) in accordance with one or more embodiments of the invention. The latching assembly (320) may be used in place of either the latching assembly (120) or the latching assembly (220) described above. As such, as discussed above, the latching assembly (320) may latch the secondary electrical module (110) to the primary electrical module (100). The latching assembly (320) includes a rotatable latching member (322) with both a latching surface (324) and an angled surface (334), a biasing member (326), a blocking member (328), a slot (330), and one or more guide pins (336). Each of these components of the latching assembly (320) is discussed below.

The rotatable latching member (322) may be a physical device for physically coupling to another electrical module, such as the primary electrical module (100). The rotatable latching member (322) is rotatable about point of rotation and may be asymmetric about the point of rotation. The rotatable latching member (322) may extend in a radial direction from the point of rotation. In one or more embodiments of the invention, the rotatable latching member (322) is in an unlatched position when in the position shown in FIG. 4.1. That is, the rotatable latching member (322) may be positioned over the slot (330).

Further, the rotatable latching member (322) includes a latching surface (324) similar to the latching surface (224) described above. Further, the rotatable latching member (322) includes an angled surface (334), which is on an opposing side of the rotatable latching member (322) when compared to the latching surface (324). The angled surface (334) may be angled such that, when the angled surface (334) engages the pin (108) of the primary electrical module (100), the rotatable latching member (322) rotates out of engagement with the blocking member (328) as shown in FIG. 4.2. As the rotatable latching member (322) is pushed further against the pin (108), the rotatable latching member (322) continues to rotate until the rotatable latching member (322) uncovers the slot (330). Continued pushing of the rotatable latching member (322) causes the latching surface (324) to engage the pin (108), as shown in FIGS. 4.3-4.4.

In one or more embodiments of the invention, the latching assembly (320) includes the biasing member (326), which is similar to the biasing member (226) described above. As shown in FIG. 4.3, the latching assembly (320) has latched to the pin (108). However, a gap (338) remains between the primary electrical module (100) and the secondary electrical module (110). As shown in FIG. 4.4, the biasing member (326) enables the latching assembly (320) to pull the secondary electrical module (110) closer to the primary electrical module (100) to further secure the connection between the two and eliminate the gap (338).

The blocking member (328) may be a physical device that may block the rotatable latching member (322) from freely rotating, similar to the blocking member (228) described above. In one or more embodiments of the invention, the blocking member (328) may be static. Because the rotatable latching member (322) includes the angled surface (334), thereby enabling the rotatable latching member (322) to rotate out of the path of the pin (108) through the slot (330), the blocking member (328) may remain static while the rotatable latching member (322) rotates out of engagement with the blocking member (328) to latch to the pin (108).

Further, the latching assembly (320) and/or the secondary electrical module (110) may include the slot (330), which is similar to the slot (230) described above.

In one or more embodiments of the present invention, the latching assembly (320) and/or the secondary electrical module (110) may include guide pins (336). The guide pins (336) may be a physical device. The guide pins (336) may extend from the secondary electrical module (110) to engage complementary slots in the primary electrical module (100). As the secondary electrical module (110) is pushed into engagement with the primary electrical module (100), the guide pins (336) enter the complementary slots in the primary electrical module (100), as shown in FIG. 4.2. The guide pins (336) may provide guidance for the secondary electrical module (110) to line-up the connectors of the secondary electrical module (110) with the complementary connectors of the primary electrical module (100). Further, any number of guide pins (336) may be included. Further, the guide pins (336) may include any suitable cross-sectional shape, including a circle, square oval, rectangle, polygon, etc.

Embodiments of the invention described above allow for a latching assembly to securely latch electrical modules to one another, regardless of slight physical variations between different modules.

The problems discussed above should be understood as being examples of problems solved by embodiments of the invention disclosed herein and the invention should not be limited to solving the same/similar problems. The disclosed invention is broadly applicable to address a range of problems beyond those discussed herein.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

The invention claimed is:

1. A latching assembly for latching an electrical module to a chassis, the assembly comprising:
   a rotatable latching member comprising a latching surface with a radius of curvature;
   a biasing member coupled to the rotatable latching member to bias the rotatable latching member toward a latched position;
   a blocking member positioned to engage and block the rotatable latching member from rotating toward the latched position; and
   a slot configured to receive a pin of the chassis such that the rotatable latching member rotates to the latched position in response to the pin being received in the slot.

2. The assembly of claim 1, wherein the blocking member is positioned over the slot such that the pin rotates the blocking member out of engagement with the rotatable latching member in response to the pin being received in the slot.

3. The assembly of claim 1, wherein the rotatable latching member further comprises an angled surface opposite of the latching surface and the angled surface is positioned over the slot such that the rotatable latching member rotates out of engagement with the blocking member in response to the pin being received in the slot.

4. The assembly of claim 3, wherein the blocking member is configured to remain static while the rotatable latching member rotates out of engagement with the blocking member.

5. The assembly of claim 1, further comprising:
a pull tab coupled to the rotatable latching member and wherein the latching member rotates from the latched position to an unlatched position in response to axial movement of the pull tab.

6. The assembly of claim 1, wherein the electrical module is operatively coupled to the chassis as the rotatable latching member rotates to the latched position.

7. The assembly of claim 1, further comprising:
a guide pin extending from the electrical module and configured to fit within a guide pin slot in the chassis.

8. The assembly of claim 1, wherein the electrical module is a network device.

9. The assembly of claim 1, wherein the biasing member is coupled to the rotatable latching member such that the biasing member only overcomes friction of the rotation of the rotatable latching member to bias the rotatable latching member toward the latched position.

10. The assembly of claim 1, further comprising:
a cover plate coupled to the blocking member and the rotatable latching member.

11. A system comprising:
a chassis comprising a bay for receiving an electrical module, an electrical connector positioned within the bay, and a pin protruding from a surface of the bay; and
the electrical module comprising:
a rotatable latching member comprising a latching surface with a radius of curvature;
a biasing member coupled to the rotatably latching member to bias the rotatable latching member toward a latched position;
a blocking member positioned to engage and block the rotatable latching member from rotating toward the latched position; and
a slot configured to receive the pin of the chassis such that the rotatable latching member rotates to the latched position in response to the pin being received in the slot.

12. The system of claim 11, wherein the blocking member is positioned over the slot such that the pin rotates the blocking member out of engagement with the rotatable latching member in response to the pin being received in the slot.

13. The system of claim 11, wherein the rotatable latching member further comprises an angled surface opposite of the latching surface and the angled surface is positioned over the slot such that the rotatable latching member rotates out of engagement with the blocking member in response to the pin being received in the slot.

14. The system of claim 13, wherein the blocking member is configured to remain static while the rotatable latching member rotates out of engagement with the blocking member.

15. The system of claim 11, further comprising:
a pull tab coupled to the rotatable latching member and wherein the latching member rotates from the latched position to an unlatched position in response to axial movement of the pull tab.

16. The system of claim 15, wherein the pull tab extends from the rotatable latching member toward and further than an end of the electrical module.

17. The system of claim 11, wherein the electrical module is operatively coupled to the chassis as the rotatable latching member rotates to the latched position.

18. The system of claim 11, further comprising:
a guide pin extending from the electrical module and configured to fit within a guide pin slot in the chassis.

19. The system of claim 11, wherein the electrical module is a network device.

20. The system of claim 11, wherein the biasing member is coupled to the rotatable latching member such that the biasing member only overcomes the friction of the rotation of the rotatable latching member to bias the rotatable latching member toward a latched position.

\* \* \* \* \*